(12) United States Patent
Smith

(10) Patent No.: US 9,171,903 B2
(45) Date of Patent: Oct. 27, 2015

(54) TRANSISTORS HAVING FEATURES WHICH PRECLUDE STRAIGHT-LINE LATERAL CONDUCTIVE PATHS FROM A CHANNEL REGION TO A SOURCE/DRAIN REGION

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/897,112

(22) Filed: May 17, 2013

(65) Prior Publication Data
US 2014/0339650 A1 Nov. 20, 2014

(51) Int. Cl.
H01L 29/66 (2006.01)
H01L 29/10 (2006.01)
H01L 29/78 (2006.01)

(52) U.S. Cl.
CPC ............ *H01L 29/1033* (2013.01); *H01L 29/78* (2013.01)

(58) Field of Classification Search
USPC .................. 257/327, 339, 345, 487, E29.255
See application file for complete search history.

(56) References Cited

U.S. PATENT DOCUMENTS

| 8,076,208 | B2 | 12/2011 | Smith |
| 8,236,640 | B2 | 8/2012 | Smith |
| 8,243,526 | B2 | 8/2012 | Smith et al. |
| 2009/0072319 | A1* | 3/2009 | Sonsky et al. ................. 257/368 |
| 2009/0278208 | A1 | 11/2009 | Chang |
| 2010/0090278 | A1* | 4/2010 | Rohrer ........................... 257/339 |
| 2010/0096697 | A1* | 4/2010 | Su et al. ......................... 257/343 |
| 2011/0127602 | A1* | 6/2011 | Mallikarjunaswamy ..... 257/331 |
| 2011/0140204 | A1 | 6/2011 | Smith et al. |
| 2012/0043608 | A1* | 2/2012 | Yang et al. ..................... 257/336 |
| 2012/0267716 | A1* | 10/2012 | Kao et al. ....................... 257/339 |

* cited by examiner

*Primary Examiner* — Thanh V Pham
(74) *Attorney, Agent, or Firm* — Wells St. John P.S.

(57) ABSTRACT

Some embodiments include transistors having a channel region under a gate, having a source/drain region laterally spaced from the channel region by an active region, and having one or more dielectric features extending through the active region in a configuration which precludes any straight-line lateral conductive path from the channel region to the source/drain region. The dielectric features may be spaced-apart islands in some configurations. The dielectric features may be multi-branched interlocking structures in some configurations.

13 Claims, 4 Drawing Sheets

TRANSISTORS HAVING FEATURES WHICH PRECLUDE STRAIGHT-LINE LATERAL CONDUCTIVE PATHS FROM A CHANNEL REGION TO A SOURCE/DRAIN REGION

TECHNICAL FIELD

Transistors.

BACKGROUND

Transistors, such as field effect transistors (FETs), having high breakdown voltages (e.g., above about 15, and in some applications to about 80 volts or greater) may be incorporated into integrated circuitry. The transistors having high breakdown voltages may be referred to as high-voltage transistors, meaning that the transistors are configured to tolerate high voltages (e.g., above 15 volts).

One technique for creating a high-voltage transistor uses a lightly-doped diffusion region (LDD region) between the drain and gate of the transistor. This region is an active area of the transistor, and is sometimes referred to as a drain extension region. One class of devices utilizing LDD regions are Reduced Surface Field Devices (RESURF) devices.

The breakdown voltage of a high-voltage transistor may be related to the length of the transistor, with longer transistors having higher breakdown voltages. A difficulty encountered in fabricating high-voltage transistors having high breakdown voltages is that such may consume a substantial amount of semiconductor real estate. A continuing goal of integrated circuit fabrication is to reduce the amount of semiconductor real estate consumed by individual devices in order to increase circuit density. Accordingly, it is desired to develop new architectures of high-voltage transistors.

DETAILED DESCRIPTION OF THE ILLUSTRATED EMBODIMENTS

Some embodiments include new high-voltage transistor architectures having increased breakdown voltage as compared to conventional high-voltage transistors of comparable length. Example embodiments are described below with reference to FIGS. 1-5.

Figure 1:
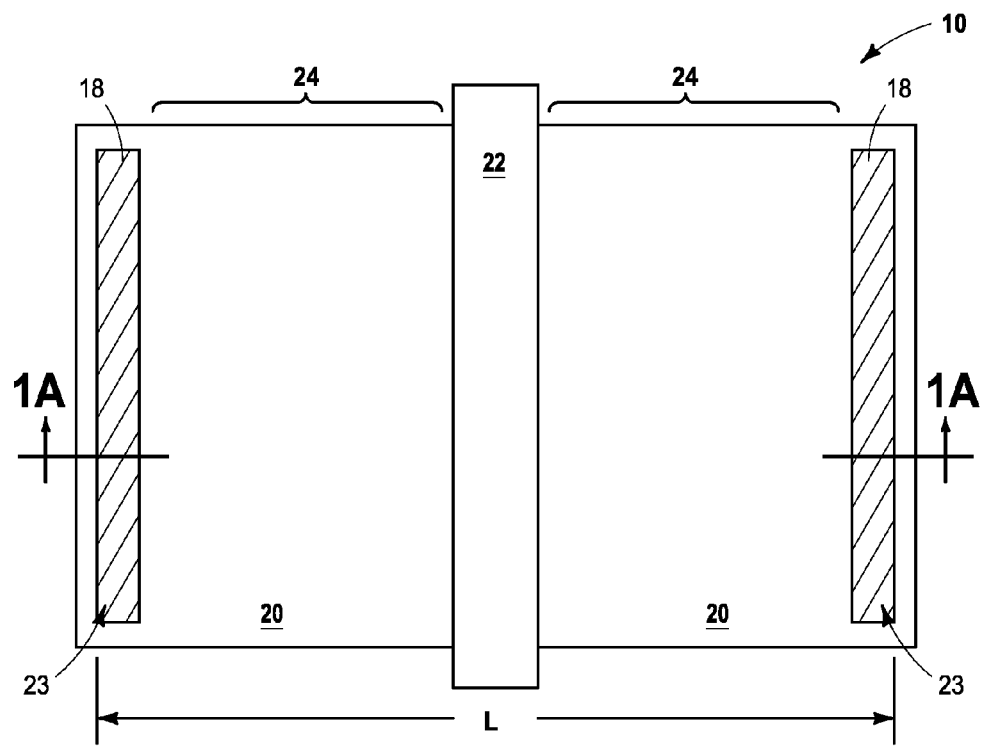
FIG. 1 is a diagrammatic top view of an example embodiment high-voltage transistor.
Figure 1A:
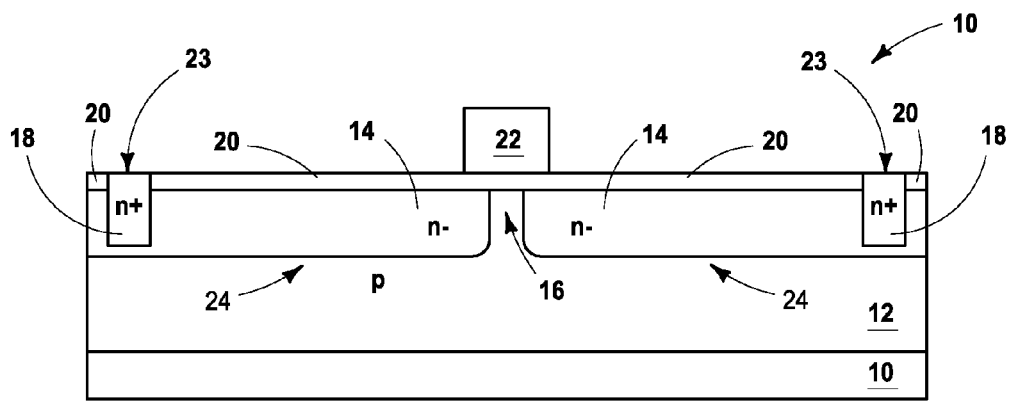
FIG. 1A is a diagrammatic cross-sectional side view along the line 1A-1A of FIG. 1.

FIGS. 1 and 1A illustrate a high-voltage transistor 10. The transistor comprises n-type doped LDD regions 14 extending into a p-type doped substrate 12. The substrate 12 may comprise, consist essentially of, or consist of monocrystalline silicon in some embodiments. In the shown embodiment, the substrate is supported by an electrically insulative material 10. Such material 10 may be any suitable composition or combination of compositions, and may, for example, comprise, consist essentially of, or consist of silicon dioxide. The shown embodiment may be an example of a silicon-on-insulator (SOI) configuration. In other embodiments, other configurations may be utilized; for example, high-voltage transistors may comprise doped regions extending into bulk semiconductor material.

The LDD regions 14 extend between a channel region 16 and heavily-doped source/drain regions 18. In the shown embodiment, the LDD regions 14 are illustrated as being doped to an "n−" concentration, and the source/drain regions 18 are illustrated as being doped to an "n+" concentration to indicate that the source/drain regions are more heavily doped than the LDD regions. Example relationships between n− and n+ dopant concentrations are described in definitions provided at the end of this section of the disclosure.

Although the illustrated transistor comprises a p-type channel, in other embodiments the illustrated dopant types may be reversed so that the transistor comprises an n-type channel, and comprises p-type LDD and source/drain regions.

Gate dielectric 20 extends across the LDD regions 14 and channel region 16, and a gate 22 is formed over the gate dielectric. The gate dielectric may comprise any suitable composition or combination of compositions; and in some embodiments may comprise, consist essentially of, or consist of one or more of silicon dioxide, hafnium oxide, aluminum oxide, zirconium oxide, etc. The gate may comprise any suitable composition or combination of compositions; and in some embodiments may comprise, consist essentially of, or consist of one or more of various metals (for instance, tungsten, titanium, etc.), metal-containing compositions (for instance, metal nitride, metal silicide, metal carbide, etc.) and conductively-doped semiconductor materials (for instance, conductively-doped silicon, conductively-doped germanium, etc.). Although the gate dielectric is shown extending entirely across the LDD regions, in other embodiments the gate dielectric may not extend across the entirety of the LDD regions.

Contact openings 23 extend through the dielectric 20 to expose upper surfaces of source/drain regions 18, and to provide locations for electrical contact to the source/drain regions. In the shown embodiment, the contact openings extend entirely across the source/drain regions. In other embodiments (not shown) one or more smaller contact openings may be utilized to provide locations for electrical contact to the source/drain regions. If dielectric 20 does not extend entirely across the LDD regions, there may be dielectric surrounding the contact regions which may the same composition as the gate dielectric, or different in composition from the gate dielectric.

In operation, an electrical state of gate 22 determines whether the LDD regions 14 are electrically coupled to one another across channel region 16. Specifically, sufficient gate voltage provides an electrical field which couples the LDD regions to one another across the channel region (i.e. the transistor is "on"), and otherwise the LDD regions are not coupled to one another through the channel region (i.e., the transistor is "off"). Such is the normal operation of transistor 10. However, if there is sufficient voltage differential between a source/drain region and the substrate or another region, then current may flow across one or more np junctions regardless of whether the transistor is in an "on" configuration or an "off" configuration. The threshold voltage differential leading to such condition is referred to as a breakdown voltage. In some applications, the breakdown voltage may correspond to a breakdown voltage between drain and source/substrate with gate/source/substrate at ground ($BV_{dss}$).

The transistor 10 may be considered to comprise active regions 24, which are regions of the LDD implants 14 between source/drain regions 18 and gate 22. Such active regions electrically couple the source/drain regions 18 to the channel region 16.

The transistor 10 has a length "L", which can determine the breakdown voltage of the transistor; with longer transistors having higher breakdown voltages. Specifically, the length of a conductive path from channel region 16 to a source/drain region 18 across an active region 24 can determine the breakdown voltage of the transistor. Some embodiments described herein utilize dielectric features within an active region as impediments such that there is no straight-line path from a channel region to a source/drain region across the active region, which effectively lengthens the path that current travels between the channel region and the source/drain region without actually lengthening the transistor. Accordingly, the breakdown voltage may be increased without increasing the size of the transistor.

Figure 2:
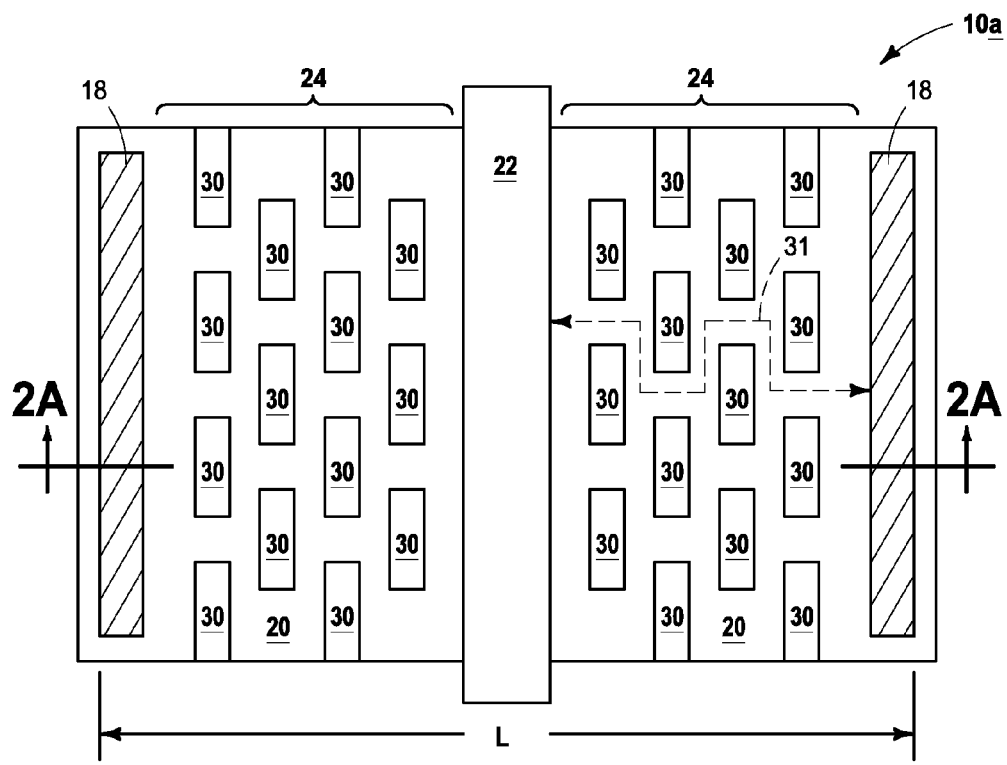
FIG. 2 is a diagrammatic top view of an example embodiment high-voltage transistor.
Figure 2A:
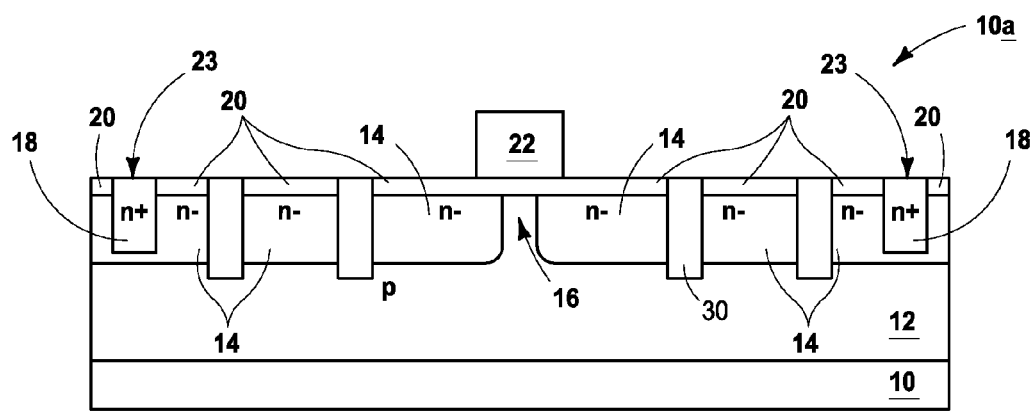
FIG. 2A is a diagrammatic cross-sectional side view along the line 2A-2A of FIG. 2.

FIGS. 2 and 2A illustrate an example embodiment high-voltage transistor 10*a* having dielectric material features 30 provided within the active regions 24 as impediments to straight-line conductive paths across the active regions. In the shown embodiment, the dielectric material features have the form of spaced-apart islands. The dielectric material features may comprise any suitable composition or combination of compositions; and in some embodiments may comprise one or more materials commonly utilized in shallow trench isolation. For instance, in some embodiments the dielectric material features 30 may comprise, consist essentially of, or consist of one or both of silicon dioxide and silicon nitride.

The illustrated islands are substantially rectangular blocks. In other embodiments, the islands may have other configurations. For instance, the islands corresponding to dielectric material features 30 may be, for example, square, hexagonal, circular, elliptical, or other polygonal and/or curved shapes.

An example conductive path extending laterally between the channel region 16 and a source/drain region 18 is shown in dashed line in FIG. 2 as a path 31. The path passes circuitously around the impediments corresponding to dielectric material features 30, which lengthens such path as compared to a straight-line lateral path between the channel region and the source/drain region. Since the dielectric material features 30 preclude all straight-line lateral paths between the channel region and the source/drain region, the high-voltage transistor 10*a* has a higher breakdown voltage as compared to a conventional transistor having the same length "L" as transistor 10*a*. Accordingly, the addition of dielectric material features 30 within active regions 24 increases breakdown voltage of a high-voltage transistor without increasing the real estate consumed by the transistor. The particular breakdown voltage may be tailored by tailoring the geometrical configurations and spacings of the dielectric material features, which can advantageously enable high-voltage transistors to be fabricated for specific applications.

The dielectric material features 30 of FIGS. 2 and 2A represent an example configuration of dielectric material features which may be utilized to preclude all straight-line lateral conductive paths between a channel region and a source/drain region. Other example configurations are described with reference to FIGS. 3-5.

Figure 3:
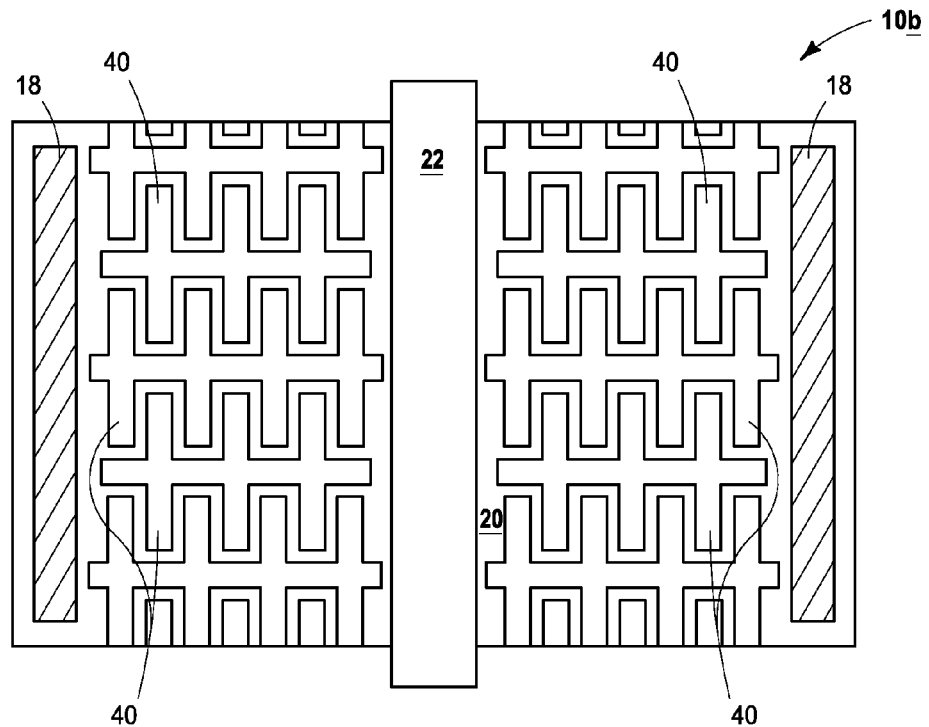
FIG. 3 is a diagrammatic top view of another example embodiment high-voltage transistor.

Referring to FIG. 3, a high-voltage transistor 10*b* comprises dielectric material features configured as interlocking multi-branched features 40. Such interlocking dielectric material features 40 preclude all straight-line lateral conductive paths between a channel region and source/drain regions 18, and thus advantageously increases breakdown voltage in a manner similar to that described above with reference to FIGS. 2 and 2A.

The transistors of FIGS. 2 and 3 may be considered to comprise first dielectric material features within a first active region on one side of gate 22, and to comprise second dielectric material features within a second active region on an opposing side of gate 22. In the embodiments of FIGS. 2 and 3, the dielectric material features within the second active region minor the dielectric material features within the first active region.

Figure 4:
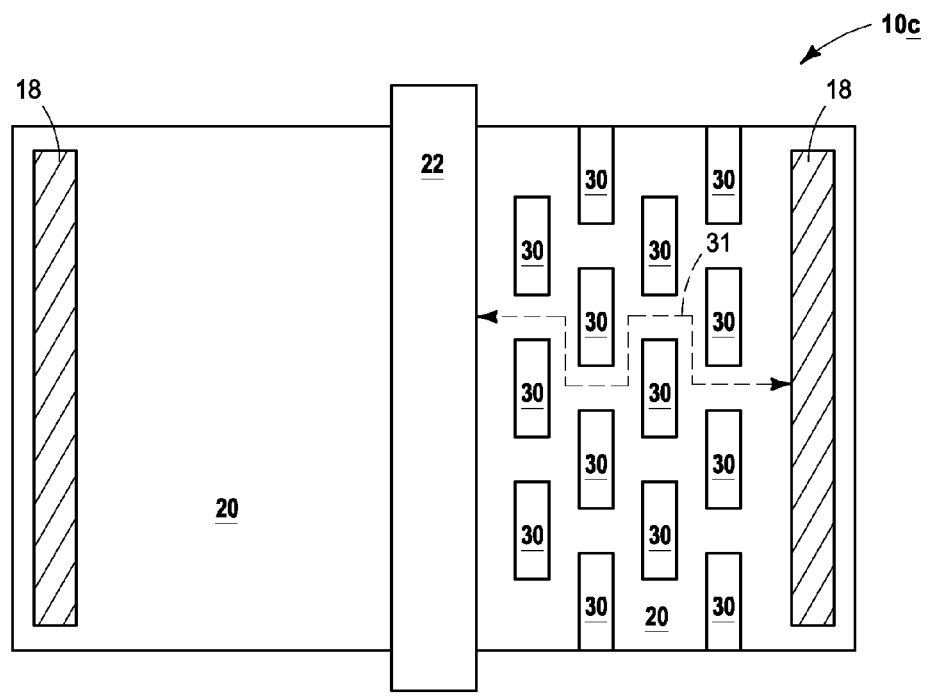
FIG. 4 is a diagrammatic top view of another example embodiment high-voltage transistor.

FIG. 4 shows a high-voltage transistor 10*c* comprising dielectric material features 30 analogous to the features described above with reference to FIGS. 2 and 2A. However, whereas the dielectric material features 30 of FIGS. 2 and 2A are uniformly distributed on both sides of gate 22 so that the dielectric features on one side of the gate are a minor image of the dielectric features on the other side of the gate, the features 30 of FIG. 4 are only on one side of the gate 22. Thus, the dielectric material features of FIG. 4 are asymmetrically distributed relative to the gate.

The embodiment of FIG. 4 may have advantages in some embodiments. For instance, in some applications one of the source/drain regions 18 carries high-voltage in an off-state of a high-voltage transistor device, and the other does not. For instance, one of the source/drain regions may be a drain region which carries high-voltage in an off-state and the other may be a source region which does not carry high high-voltage in the off-state. In such embodiments, the dielectric material features 30 may be arranged to be primarily between the gate and the drain region; and it may be advantageous to avoid the material costs and fabrication expense of forming dielectric material features between the source region and the gate.

The high-voltage transistor of FIG. 4 may be considered to comprise a first source/drain region on one side of gate 22, and a second source/drain region on the other side of the gate. The transistor may be further considered to comprise a first active region on the side adjacent the first source/drain region, and a second active region on the side adjacent the second source/drain region. The illustrated transistor comprises dielectric material features 30 within the first active region, and comprises no dielectric material features within the second active region. In other embodiments, there may be some dielectric material features between the gate 22 and both of the source/drain regions 18, but fewer on one side of the gate 22 than on the other. In such embodiments, a high-voltage transistor may be considered to comprise more dielectric material features in a first active region on one side of a gate than in a second active region on another side of the gate.

Figure 5:
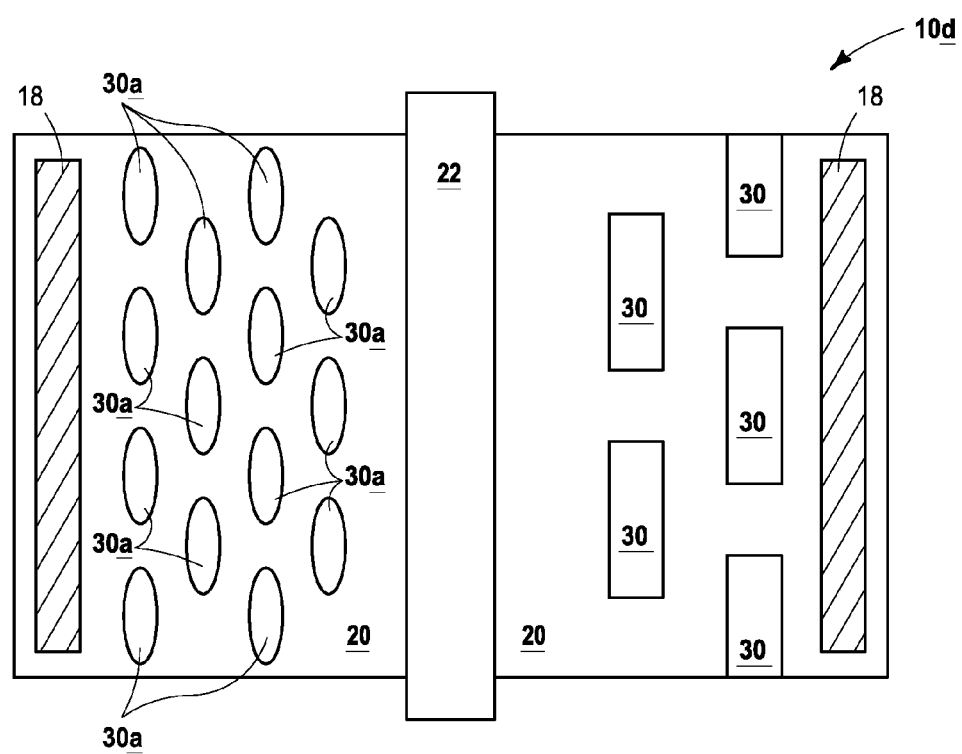
FIG. 5 is a diagrammatic top view of another example embodiment high-voltage transistor.

FIG. 5 shows an example embodiment high-voltage transistor 10*d* having a different arrangement of dielectric material features on one side of a gate than on an opposing side of the gate. In the shown embodiment, the dielectric material features 30 on side of the gate are substantially rectangular, and dielectric material features 30*a* on an opposing side of the gate are substantially elliptical. The asymmetry of the transistor 10*d* may enable transistor 10*d* to be tailored for a particular application.

The example high-voltage transistor of FIG. 5 is one of many examples in which dielectric material features may be provided on both sides of a gate, and asymmetrically relative to the gate.

Although dielectric material features are shown in the accompanying figures as being utilized in high-voltage transistors, in some embodiments analogous dielectric material features may be utilized in other transistors, which may or may not be high voltage transistors.

The high-voltage transistors discussed herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some of the figures show various different dopant levels, and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p− region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

In some embodiments, a transistor comprises a channel region under a gate, a source/drain region laterally spaced from the channel region by an active region, and one or more dielectric features extending through the active region in a configuration which precludes any straight-line lateral conductive path from the channel region to the source/drain region.

In some embodiments, a transistor comprises a channel region under a gate, a source/drain region laterally spaced from the channel region by an active region, and multiple spaced-apart dielectric islands extending through the active region in a configuration which precludes any straight-line lateral conductive path from the channel region to the source/drain region.

In some embodiments, a transistor comprises a channel region under a gate, a source/drain region laterally spaced from the channel region by an active region, and interlocking multi-branched dielectric features extending through the active region in a configuration which precludes any straight-line lateral conductive path from the channel region to the source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A transistor comprising:
   a channel region under a gate;
   a source/drain region laterally spaced from the channel region by an active region;
   one or more dielectric features extending through the active region in a configuration which precludes any straight-line lateral conductive path from the channel region to the source/drain region; and
   wherein the dielectric features are configured as spaced-apart interlocking structures.

2. A transistor comprising:
   a channel region under a gate;
   a source/drain region laterally spaced from the channel region by an active region;
   one or more dielectric features extending through the active region in a configuration which precludes any straight-line lateral conductive path from the channel region to the source/drain region; and
   wherein the source/drain region is a first source/drain region on one side of the gate, and further comprising a second source/drain region on an opposing side of the gate from said first source/drain region; wherein the active region is a first active region on one side of the gate, and further comprising a second active region on an opposing side of the gate from the first active region, wherein the dielectric features are first dielectric features within the first active region, and further comprising second dielectric features within the second active region.

3. The transistor of claim 2 wherein the second dielectric features within the second active region mirror the first dielectric features within the first active region.

4. The transistor of claim 2 wherein the second dielectric features within the second active region do not mirror the first dielectric features within the first active region.

5. A transistor comprising:
a channel region under a gate;
a source/drain region laterally spaced from the channel region by an active region;
multiple spaced-apart dielectric features corresponding to dielectric islands extending through the active region in a configuration which precludes any straight-line lateral conductive path from the channel region to the source/drain region; and
wherein the source/drain region is a first source/drain region on one side of the gate, and further comprising a second source/drain region on an opposing side of the gate from said first source/drain region; wherein the active region is a first active region on one side of the gate, and further comprising a second active region on an opposing side of the gate from the first active region, wherein the dielectric features are first dielectric features within the first active region, and further comprising second dielectric features within the second active region.

6. The transistor of claim 5 wherein the second dielectric features within the second active region mirror the first dielectric features within the first active region.

7. The transistor of claim 5 wherein the second dielectric features within the second active region do not mirror the first dielectric features within the first active region.

8. A transistor comprising:
a channel region under a gate;
a source/drain region laterally spaced from the channel region by an active region; and
interlocking multi-branched dielectric features extending through the active region in a configuration which precludes any straight-line lateral conductive path from the channel region to the source/drain region.

9. The transistor of claim 8 being a high-voltage transistor.

10. The transistor of claim 8 wherein the source/drain region is a first source/drain region on one side of the gate, and further comprising a second source/drain region on an opposing side of the gate from said first source/drain region; wherein the active region is a first active region on one side of the gate, and further comprising a second active region on an opposing side of the gate from the first active region, wherein the dielectric features are first dielectric features within the first active region, and wherein there are no dielectric features within the second active region.

11. The transistor of claim 8 wherein the source/drain region is a first source/drain region on one side of the gate, and further comprising a second source/drain region on an opposing side of the gate from said first source/drain region; wherein the active region is a first active region on one side of the gate, and further comprising a second active region on an opposing side of the gate from the first active region, wherein the dielectric features are first dielectric features within the first active region, and further comprising second dielectric features within the second active region.

12. The transistor of claim 11 wherein the second dielectric features within the second active region mirror the first dielectric features within the first active region.

13. The transistor of claim 11 wherein the second dielectric features within the second active region do not mirror the first dielectric features within the first active region.

\* \* \* \* \*